United States Patent
Nakamura et al.

(10) Patent No.: US 6,887,560 B2
(45) Date of Patent: May 3, 2005

(54) MULTILAYER FLEXIBLE WIRING CIRCUIT BOARD AND ITS MANUFACTURING METHOD

(75) Inventors: Kei Nakamura, Osaka (JP); Satoshi Tanigawa, Osaka (JP); Hiroshi Yamazaki, Osaka (JP); Mineyoshi Hasegawa, Osaka (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 10/363,165

(22) PCT Filed: Jul. 3, 2002

(86) PCT No.: PCT/JP02/06717

§ 371 (c)(1),
(2), (4) Date: Mar. 5, 2003

(87) PCT Pub. No.: WO03/005788

PCT Pub. Date: Jan. 16, 2003

(65) Prior Publication Data

US 2004/0035520 A1 Feb. 26, 2004

(51) Int. Cl.$^7$ ................................................ B32B 3/00
(52) U.S. Cl. ...................... 428/209; 428/901; 174/254; 174/255
(58) Field of Search ................ 428/209, 901; 174/254, 255, 250, 262, 259

(56) References Cited

U.S. PATENT DOCUMENTS

| | | | | |
|---|---|---|---|---|
| 4,306,925 A | * | 12/1981 | Lebow et al. | 156/150 |
| 4,642,160 A | * | 2/1987 | Burgess | 216/18 |
| 4,937,133 A | * | 6/1990 | Watanabe et al. | 428/209 |
| 5,451,721 A | * | 9/1995 | Tsukada et al. | 174/261 |
| 5,478,972 A | * | 12/1995 | Mizutani et al. | 174/250 |
| 6,204,456 B1 | * | 3/2001 | Lauffer et al. | 174/262 |
| 6,335,076 B1 | * | 1/2002 | Nakamura et al. | 428/209 |
| 6,373,000 B2 | * | 4/2002 | Nakamura et al. | 174/264 |
| 6,591,491 B2 | * | 7/2003 | Fujii et al. | 29/830 |

FOREIGN PATENT DOCUMENTS

| | | |
|---|---|---|
| EP | 1069811 A2 | 1/2001 |
| JP | 7-283533 A | 10/1995 |
| JP | 10-27961 A | 1/1998 |
| JP | 2001-28482 | 1/2001 |
| JP | 2001-237512 | 8/2001 |
| WO | WO 03/005788 A1 | 1/2003 |

* cited by examiner

*Primary Examiner*—Cathy F. Lam
(74) *Attorney, Agent, or Firm*—Jean C. Edwards, Esq.; Dickinson Wright PLLC

(57) ABSTRACT

A multilayer flexible wired circuit board that can provide high density wiring and also can provide reduction in thickness and size, and a producing method thereof. A four-layered flexible wired circuit board is produced by preparing a double-sided substrate in which a first conductor layer and a second conductor layer are laminated on both sides of a first insulating layer; preparing a first single-sided substrate in which a third conductor layer is laminated on one surface of a second insulating layer and a second single-sided substrate in which a fourth conductor layer is laminated on one surface of a third insulating layer; bonding the first conductor layer and the third conductor layer to each other through a first thermosetting adhesive layer; and bonding the second conductor layer and the fourth conductor layer to each other through a second thermosetting adhesive layer.

6 Claims, 4 Drawing Sheets

MULTILAYER FLEXIBLE WIRING CIRCUIT BOARD AND ITS MANUFACTURING METHOD

This application is a 35 U.S.C. 371 National Stage entry of PCT/JP02/06717, filed Jul. 3, 2002, which claims priority from Japanese Patent Application No. 2001-204886, filed Jul. 5, 2001.

TECHNICAL FIELD

The present invention relates to a multilayer flexible wired circuit board and to a method of producing the multilayer flexible wired circuit board.

BACKGROUND ART

The multilayer flexible wired circuit board, which is a flexible wired circuit board having a plurality of conductor layers, is being widely used in electronic equipment and parts in recent years, to meet the demand for electronic equipment and parts to have increasingly higher density. The multilayer flexible wired circuit board is usually produced in the method shown in FIG. 4.

Specifically, a double-sided substrate 4, in which a first conductor layer 2 and a second conductor layer 3 are laminated on both sides of a first insulating layer 1, respectively, is prepared, first, as shown in FIG. 4(a). Then, a second insulating layer 7 and a third insulating layer 8 are laminated on the first conductor layer 2 and the second conductor layer 3 of the double-sided substrate 4 through a first adhesive layer 5 and a second adhesive layer 6, respectively, as shown in FIG. 4(b).

Also, a first single-sided substrate 11 in which a third conductor layer 10 is laminated on a fourth insulating layer 9 and a second single-sided substrate 14 in which a fourth conductor layer 13 is laminated on a fifth insulating layer 12 are prepared separately, as shown in FIG. 4(c). Then, a first cover insulating layer 16 is laminated on the third conductor layer 10 of the first single-sided substrate 11 through a third adhesive layer 15, and a second cover insulating layer 18 is laminated on the fourth conductor layer 13 of the second single-sided substrate 14 through a fourth adhesive layer 17, as shown in FIG. 4(d).

Then, the fourth insulating layer 9 of the first single-sided substrate 11 is laminated on the second insulating layer 7 laminated on the double-sided substrate 4 through a fifth adhesive layer 19, and the fifth insulating layer 12 of the second single-sided substrate 14 is laminated on the third insulating layer 8 laminated on the double-sided substrate 4 through a sixth adhesive layer 20, as shown in FIG. 4(e).

This method has the problem that the multiple flexible wired circuit board thus produced provides increase in number of layers and thus increase in thickness so that it cannot meet the demand in recent years for thinner lamination of wired circuit board.

SUMMARY OF THE INVENTION

It is the object of the invention to provide a multilayer flexible wired circuit board that can provide high density wiring and also can provide reduction in thickness and size, and a producing method thereof.

The present invention provides a multilayer flexible wired circuit board having at least four conductor layers, wherein conductor layers are laminated on both sides of an insulating layer, respectively, and another conductor layers are bonded to the conductor layers, respectively, through an adhesive layer.

According to the multilayer flexible wired circuit board of the present invention, since the conductor layers are bonded directly to another conductor layers through the adhesive layer without any insulating layer being interposed therebetween, the multilayer flexible wired circuit board can be reduced in thickness by that extent.

Hence, the multilayer flexible wired circuit board of the present invention can provide a higher density wiring and reduction in thickness and size.

In the multilayer flexible wired circuit board of the present invention, conductive passages for electrically connecting between the two conductor layers bonded to each other through the adhesive layer may be formed in the adhesive layer.

This enables the conductive passages to be formed in a simple manner simply by directly interconnecting the mutually bonded two conductor layers in the adhesive layer. This can provide improved production efficiency resulting from the simplified construction and reduced production costs.

Further, it is preferable that the conductive passages are formed by solder powders, which are charged in openings formed to extend through the adhesive layer in a thickness direction thereof, being melted by heating in the condition in which the adhesive layer is interposed between the two conductor layers.

In this construction in which the conductive passages are formed by solder powders being melted by heating in the condition in which the adhesive layer is interposed between the two conductor layers, even when the adhesive layer is reactively cured further by the melting of the solder powders by heating, the adhesion strength between the two conductor layers increases as the curing of the adhesive layer proceeds. As a result of this, sufficient adhesion strength between these two conductor layers can be obtained.

Also, the present invention includes a method of producing a multilayer flexible wired circuit board comprising the step of preparing a double-sided substrate in which conductor layers are laminated on both sides of an insulating layer, respectively; and the step of bonding another conductor layers to the conductor layers, respectively, through an adhesive layer.

According to this method of the present invention, since the conductor layers laminated on the insulating layer are bonded directly to another conductor layers through the adhesive layer without any insulating layer being interposed therebetween, the multilayer flexible wired circuit board can be reduced in thickness by that extent.

Hence, this method of the present invention can produce a multilayer flexible wired circuit board that can provide a higher density wiring and reduction in thickness and size.

It is preferable that this method further comprises the step of forming conductive passages for electrically connecting between the two conductor layers bonded to each other through the adhesive layer and this conductive passage forming step comprises the step of forming openings to extend through the adhesive layer in a thickness direction thereof; the step of charging solder powders in the openings under normal temperature; the step of melting the solder powders charged in the openings by heating in the condition in which the adhesive layer is interposed between the two conductor layers.

In this conductive passage forming process, since the solder powders are charged under normal temperature and also melted by heating in the condition in which the adhesive layer is interposed between the two conductor layers, even when the adhesive layer is reactively cured further in the melting of the solder powders by heating, the adhesion strength between the two conductor layers increases as the curing of the adhesive layer proceeds. As a result of this, sufficient adhesion strength between these two conductor layers can be obtained.

Figure 1:
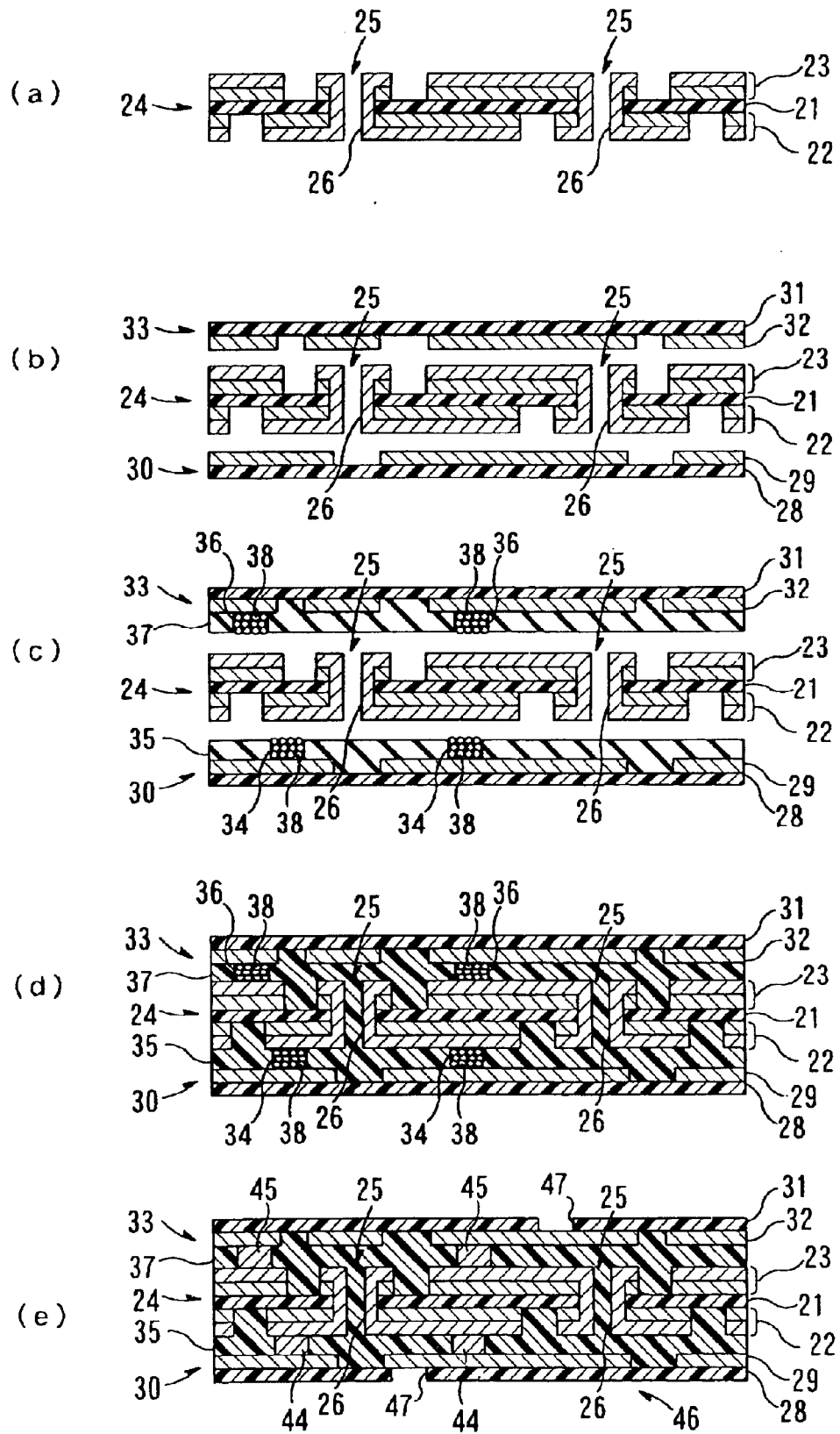
FIG. 1 illustrates a production process of a multilayer flexible wired circuit board producing method of an embodiment of the present invention.
Figure 2:
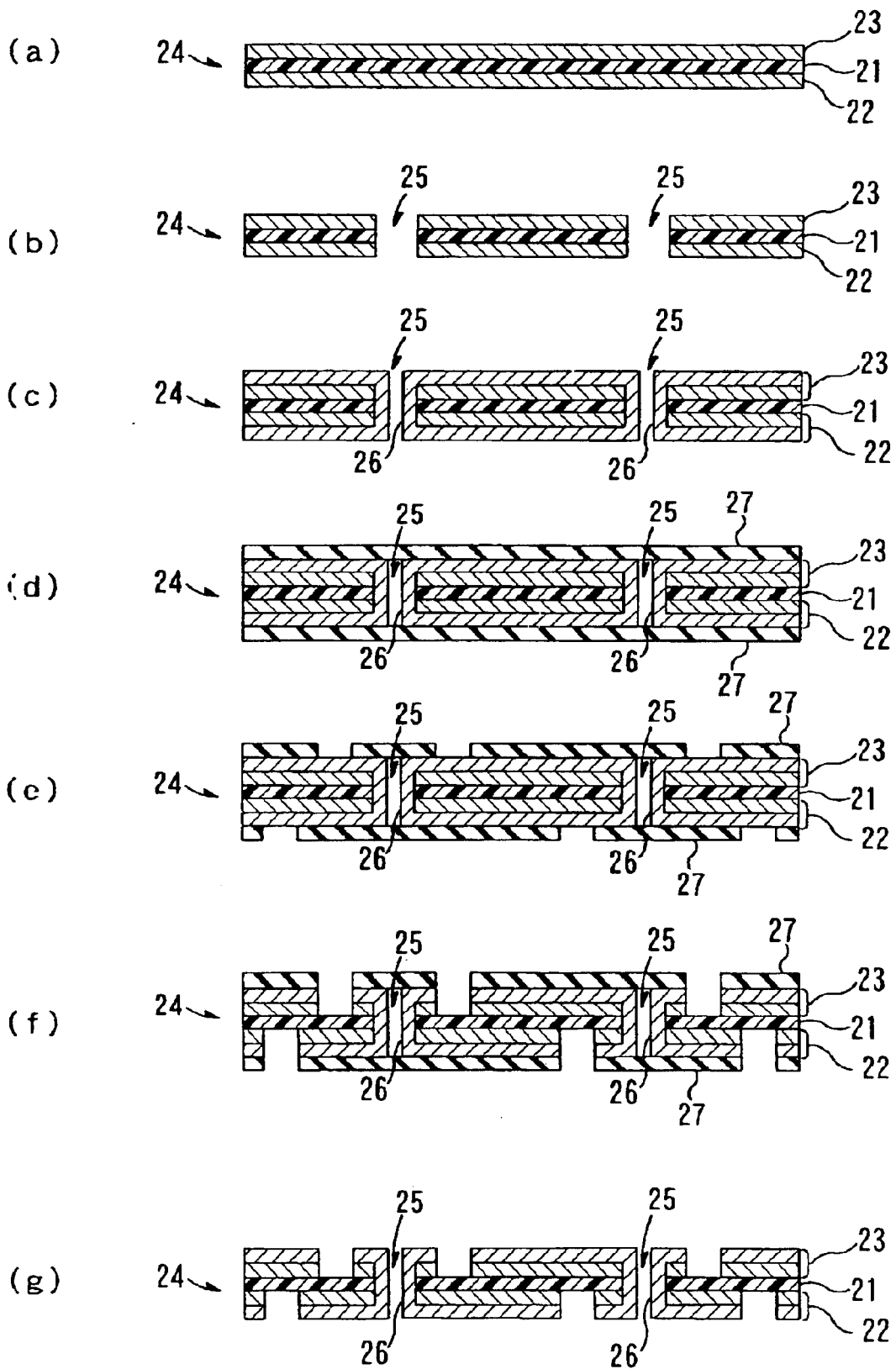
Figure 3:
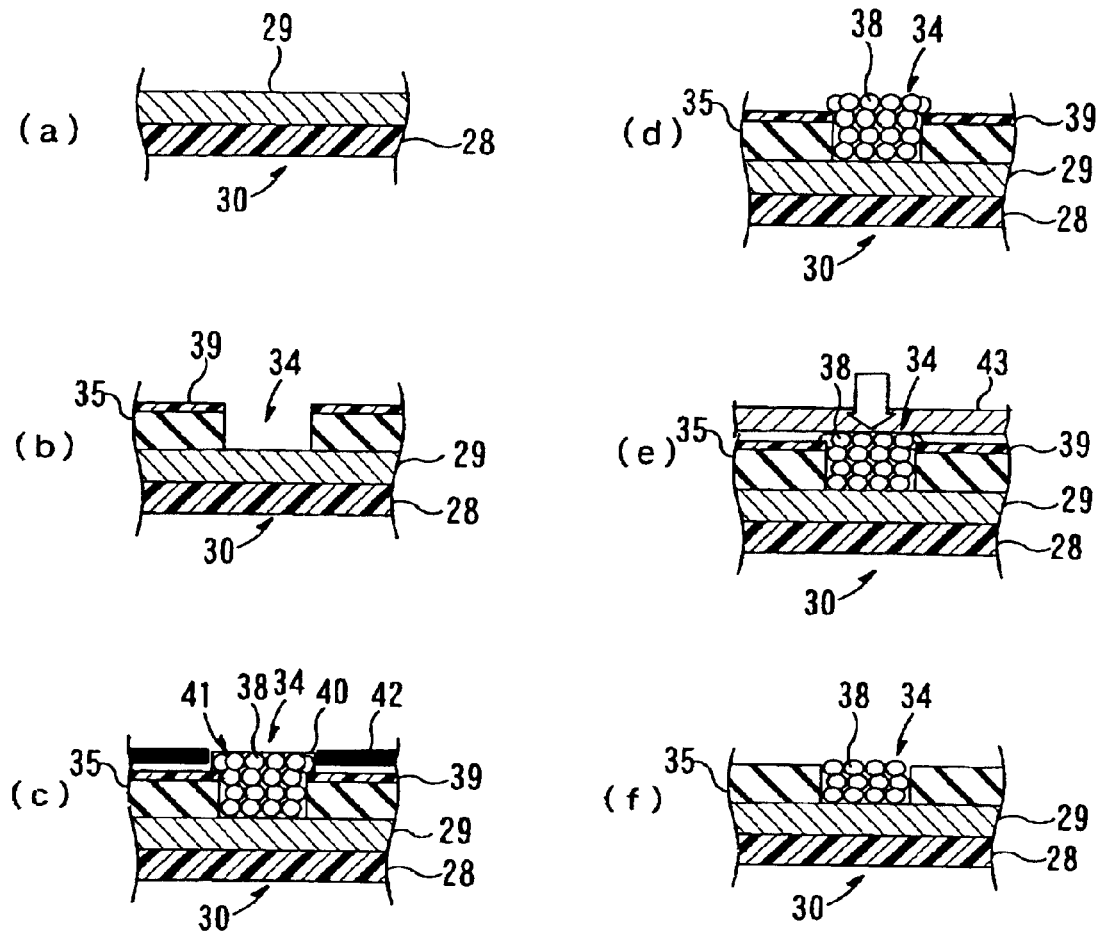
Figure 4:
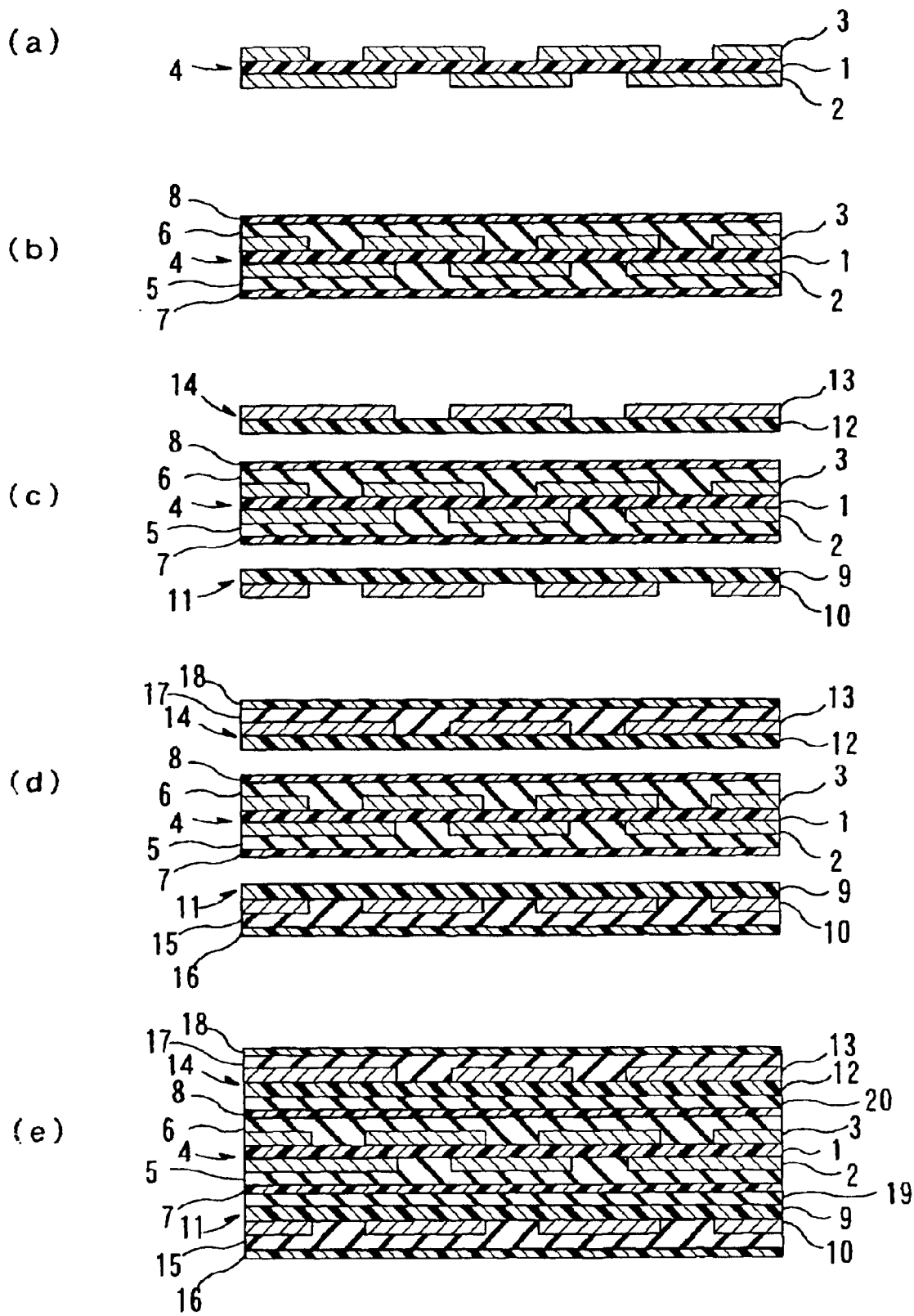

(a) illustrates the process of preparing a double-sided substrate;

(b) illustrates the process of preparing a first single-sided substrate and a second single-sided substrate;

(c) illustrates the process of laminating a first thermosetting adhesive layer having first openings filled with solder powders on a third conductor layer and also laminating a second thermosetting adhesive layer having second openings filled with solder powders on a fourth conductor layer;

(d) illustrates the process of laminating the first thermosetting adhesive layer laminated on the first single-sided substrate on a first conductor layer of the double-sided substrate and also laminating the second thermosetting adhesive layer laminated on the second single-sided substrate on a second conductor layer of the double-sided substrate; and (e) illustrates the process of melting solder powders by heating to form a first conductive passage and a second conductive passage, FIG. 2 illustrates the production process of the double-sided substrate shown in FIG. 1(a):

(a) illustrates the process of laminating the first conductor layer and the second conductor layer on both sides of the first insulating layer, respectively;

(b) illustrates the process of forming through holes in the double-sided substrate;

(c) illustrates the process of forming through-holed plated layers in the through holes;

(d) illustrates the process of laminating photoresists on the first conductor layer and the second conductor layer, respectively;

(e) illustrates the process of exposing the photoresists to light to develop them;

(f) illustrates the process of etching the first conductor layer and the second conductor layer; and (g) illustrates the process of removing the photoresists, FIG. 3 illustrates a principal part of the production process shown in FIG. 1(c), illustrating the details of the process of laminating the first thermosetting adhesive layer having the first openings on the third conductor layer, to charge the solder powders in the first openings:

(a) illustrates the process of preparing a first single-sided substrate;

(b) illustrates the process of laminating the first thermosetting adhesive layer having the first openings on the third conductor layer of the first single-sided substrate;

(c) illustrates the process of printing the solder paste prepared by mixing the solder powders in a solvent on the first thermosetting adhesive layer through a metal mask;

(d) illustrates the process of removing the solvent by drying;

(e) illustrates the process of applying a pressure on the solder powders under normal temperature; and (f) illustrates the process of peeling off the separator to remove surplus solder powders flowing over the first openings together with the separator, and FIG. 4 illustrates the production process of an embodiment of a conventional multilayer flexible wired circuit board producing method:

(a) illustrates the process of preparing the double-sided substrate;

(b) illustrates the process of laminating the second insulating layer and the third insulating layer on the first conductor layer and the second conductor layer through the first adhesive layer and the second adhesive layer, respectively;

(c) illustrates the process of preparing the first single-sided substrate and the second single-sided substrate;

(d) illustrates the process of laminating the first cover insulating layer on the third conductor layer of the first single-sided substrate through the third adhesive layer, and laminating the second cover insulating layer on the fourth conductor layer of the second single-sided substrate through the fourth adhesive layer; and (e) illustrates the process of laminating the fourth insulating layer of the first single-sided substrate on the second insulating layer of the double-sided substrate through the fifth adhesive layer, and laminating the fifth insulating layer of the second single-sided substrate on the third insulating layer of the double-sided substrate through the sixth adhesive layer.

DESCRIPTION THE OF INVENTION

FIG. 1 illustrates an embodiment of a production process of a multilayer flexible wired circuit board producing method of the present invention. In the following, an embodiment of a method of producing a multilayer flexible wired circuit board of the present invention is described with reference to FIG. 1.

In this method, a double-sided substrate 24 in which a first conductor layer 22 and a second conductor layer 23, each being formed in a specific wired circuit pattern, are laminated on both sides of a first insulating layer 21, respectively, is prepared, first, as shown in FIG. 1(a).

No particular limitation is imposed on the materials of the first insulating layer 21, as long as they are commonly used for the insulating layer of the wired circuit board. For example, films of synthetic resins, such as a polyimide resin, an acrylic resin, a polyether nitrile resin, a polyether sulfonic resin, a polyester resin, a polyethylene naphthalate resin, and a polyvinyl chloride resin may be used as the insulating layer 21. The film of a polyimide resin is preferably used. The first insulating layer 11 is usually formed to have thickness of 9–100 $\mu$m, or preferably 9–35 $\mu$m.

No particular limitation is imposed on the materials of the first conductor layer 22 and the second conductor layer 23, as long as they are commonly used for the conductor layers of the wired circuit board. For example, foils of metals, such as copper, nickel, gold, solder or their alloys may be used for the first conductor layer 22 and the second conductor layer 23. Preferably, the copper foil is used. Each of the first conductor layer 22 and the second conductor layer 23 usually has thickness of 9–50 $\mu$m, or preferably 9–25 $\mu$m.

The double-sided substrate 24 shown in FIG. 1(a) in which the first conductor layer 22 and the second conductor layer 23 are formed in a specific wired circuit pattern on both sides of the first insulating layer 21, respectively, can be produced in the processes shown in FIG. 2, for example. That is to say, the first conductor layer 22 and the second conductor layer 23 are laminated on both sides of the first insulating layer 22, respectively, to produce the double-sided substrate 24, first, as shown in FIG. 2(a).

The first conductor layer 22 and the second conductor layer 23 may be laminated on the both sides of the first insulating layer 22, respectively, for example, by adhesive bonding the first conductor layer 22 and the second conductor layer 23, each comprising a metal foil, to the both sides of the first insulating layer 21 comprising a synthetic resin film through adhesive layers, respectively. It is preferable, however, that the first conductor layer 22 and the second conductor layer 23 are laminated directly on the both sides of the first insulating layer 21, respectively, without any adhesive layer interposed therebetween.

Though no particular limitation is imposed on the method for laminating the first conductor layer 22 and the second conductor layer 23 directly on the both sides of the first insulating layer 21, the first conductor layer 22 and the second conductor layer 23 can be laminated directly on the first insulating layer 21 in the following manner, for example. That is to say, the first conductor layer 22 comprising the metal foil is uniformly coated with synthetic resin solution, first. Then, the coating is dried and, if needed, heated to form the first insulating layer 21 on the first conductor layer 22. Sequentially, the second conductor layer 23 is laminated on the first insulating layer 21 (on the side thereof opposite to the side on which the first conductor layer 22 is laminated) by laminating the metal foil thereon or by plating.

To be more specific, for example, after the surface of the first conductor layer 22 comprising a copper foil is uniformly coated with polyamic acid resin solution, the coating is dried. Sequentially, the second conductor layer 23 comprising the copper foil is laminated on the coating of the first conductor layer 22 and then the coating of the polyamic acid resin is finally heated to 300° C. or more to be cured (imidized), whereby the first insulating layer 21 comprising the polyimide resin is formed.

Alternatively, for example, after the surface of the first conductor layer 22 comprising the copper foil is uniformly coated with polyamic acid resin solution, the coating is dried and then is cured (imidized), to form the first insulating layer 21 comprising the polyimide resin, first. Then, the second conductor layer 23 is formed on the surface of the first insulating layer 21 by copper plating.

The double-sided substrate 24 in which the first conductor layer 22 and the second conductor layer 23 are laminated directly on the both sides of the first insulating layer 21, respectively, is commercially available. In this method, such a commercially available product may be used.

Then, through holes 25 are formed in specific areas of the double-sided substrate 24, as shown in FIG. 2(b), and then through hole plated layers 26 are formed in the through holes 25, as shown in FIG. 2(c).

The through holes 25 are formed in the double-sided substrate 24 to extend through it in a thickness direction thereof in a known manner, such as a-boring with a drill, boring with a laser beam, and etching. The through holes 25 have a diameter of 50–300 $\mu m\Psi$, or preferably 50–200 $\mu m\Psi$, when formed in a circular shape.

The through hole plated layers 26 are formed to continuously extend between the first conductor layer 22 and the second conductor layer 23 by plating the through holes 25 over with metal, such as copper, nickel, gold, solder or alloys thereof. As a result of this, the first conductor layer 22 and the second conductor layer 23 are electrically connected with each other through the through hole plated layers 26.

The through hole plated layers 26 usually have thickness of 9–30 $\mu m$, or preferably 9–18 $\mu m$. The plated layers formed by the through hole plated layers 26 usually extend from the through holes 25 to a front surface of the first conductor layer 22 and a front surface of the second conductor layer 23 continuously. The plated layers extending over the front surface of the first conductor layer 22 and the front surface of the second conductor layer 23 are integrally combined with the previously formed first conductor layer 22 and the previously formed second conductor layer 23 to form the first conductor layer 22 and the second conductor layer 23.

Sequentially, the first conductor layer 22 and the second conductor layer 23 laminated on the both sides of the first insulating layer 22, respectively, are each formed in a specific wired circuit pattern. A subtractive process is used to form the first conductor layer 22 and the second conductor layer 23 in a specific wired circuit pattern, respectively. In the subtractive process, photoresists 27 are laminated on the surface of the first conductor layer 22 and the surface of the second conductor layer 23, respectively, first, as shown in FIG. 2(d). In the lamination of the photoresists 27, for example photosensitive dry film resists may be laminated in a known manner. Sequentially, the photoresists 27 are exposed to light through photomasks corresponding to the specific pattern and then are developed, as shown in FIG. 2(e). The exposure and development of the photoresists 27 may be performed in a known manner. The photoresists 27 are each developed into a specific resist pattern in accordance with difference in solubility of developing agent between the exposed area and the unexposed area.

Then, the first conductor layer 22 and the second conductor layer 23 are etched, respectively, as shown in FIG. 2(f). The first conductor layer 22 and the second conductor layer 23 may be wet-etched by using etchant. The etchants that may be used include, for example, sulfuric acid, sulfuric acid solution, cupric (II) chloride solution, ferric (III) chloride solution, ammonium persulfate solution, and ammonia alkaline solution. Thereafter, the photoresists 27 are removed in a known manner to obtain the double-sided substrate 24 in which the first conductor layer 22 and the second conductor layer 23, each being formed in a specific wired circuit pattern, are laminated on the both sides of the first insulating layer 21, as shown in FIG. 2(g).

In addition to the subtractive process mentioned above, other known patterning process, such as an additive process and a semi-additive process, may be used to form the first conductor layer 22 and the second conductor layer 23 on the both sides of the first insulating layer 22 in their respective specific wired circuit pattern.

Sequentially, in this method, a first single-sided substrate 30 in which a third conductor layer 29 formed in a specific wired circuit pattern is laminated on one side of a second insulating layer 28 and a second single-sided substrate 33 in which a fourth conductor layer 32 formed in a specific wired circuit pattern is laminated on one side of a third insulating layer 31 are prepared, as shown in FIG. 1(b).

The same material as the material of the first insulating layer 21 may be used for the second insulating layer 28 and the third insulating layer 31. Also, the same material as the material of the first conductor layer 22 and the second conductor layer 23 may be used for the third conductor layer 29 and the fourth conductor layer 32.

The first single-sided substrate 30 and the second single-sided substrate 33 may be formed by forming the third conductor layer 29 on the second insulating layer 28 and the fourth conductor layer 32 on the third insulating layer 31 in their respective specific wired circuit patterns in any known patterning process, such as the subtractive process, the additive process or the semi-additive process, as mentioned above.

The first single-sided substrate 30 in which the third conductor layer 29 is laminated on one side of the second insulating layer 28 and the second single-sided substrate 33 in which the fourth conductor layer 32 is laminated on one side of the third insulating layer 31 are commercially available. In this method, such commercially available products may be used to form the third conductor layer 29 and the fourth conductor layer 32 in their respective specific wired circuit patterns in the subtractive process, as is the case with the above-mentioned case.

Sequentially, in this process, as shown in FIG. 1(c), a first thermosetting adhesive layer 35 having first openings 34 is laminated on the third conductor layer 29 of the first single-sided substrate 30 and then solder powders 38 are charged in the first openings 34 under normal temperature. In addition, a second thermosetting adhesive layer 37 having second openings 36 is laminated on the fourth conductor layer 32 of the second single-sided substrate 33 and then the solder powders 38 are charged in the second openings 36 under normal temperature.

No particular limitation is imposed on the thermosetting adhesive of the first thermosetting adhesive layer 35 and the second thermosetting adhesive layer 37, as long as it can be usually used for the adhesive layer of the wired circuit board and can be put into the B-stage state (the state in which the thermosetting adhesive is cured to such an extent that the adhesive layer can be held in its specific form). For example, acrylic adhesive, epoxy adhesive, amideimide adhesive, polyimide adhesive, and blended adhesives thereof can be cited as the thermosetting adhesive. The first thermosetting adhesive layer 35 and the second thermosetting adhesive layer 37 usually have thickness of 25–100 μm, or preferably 40–60 μm. Also, the thermosetting adhesive to be cured in temperature of not less than 100° C., or preferably 125–200° C., is preferably used.

Referring now to FIG. 3, this process will be described in detail. It is to be noted that as the first single-sided substrate 30 and the second single-sided substrate 33 are both subjected to the same process, reference is made exclusively to the first single-sided substrate 30, showing only the processes of the first single-sided substrate 30 in FIG. 3.

In this process, on the third conductor layer 29 of the first single-sided substrate 30 shown in FIG. 3(a), the first thermosetting adhesive layer 35 having the first openings 34 is laminated in its B-stage state as shown in FIG. 3(b).

The first thermosetting adhesive layer 35 can be laminated on the third conductor layer 29 in the B-stage state in the following manner, for example. After solution containing the thermosetting adhesive is applied to the third conductor layer 29, the solution is dried by heating so that the adhesive can be put into the B-stage state at the same time as the solution is dried. Alternatively, an adhesive sheet comprising thermosetting adhesive previously put in the B-stage state may be laminated on (temporarily bonded to) the third conductor layer 29 by application of heat thereto and/or by application of pressure thereon.

The first opening 34 may be formed in the first thermosetting adhesive layer 35 by using a laser, such as a YAG laser or a CO₂ laser, after the first thermosetting adhesive layer 35 is laminated on the third conductor layer 29. When the adhesive sheet is laminated on the third conductor layer 29, the first opening 34 may be previously formed in that adhesive sheet with a drill, a punch or the like before the adhesive sheet is laminated thereon. The first opening 34 is formed to extend through the first thermosetting adhesive layer 35 in thickness direction thereof at a position in the third conductor layer 29 opposed to a connecting area with the first conductor layer 22. Preferably, the first opening 34 has a diameter of 50–300 μm, or preferably 50–200 μm, when formed in a circular shape, for example.

In order to keep the first thermosetting adhesive layer 35 from the solder powders 38 adhering to its unwanted locations in the solder powder 38 charging process mentioned later, a separator 39 is preferably laminated on a surface of the first thermosetting adhesive layer 35 on a side thereof opposite to the side thereof contacting with the third conductor layer 29.

Films of synthetic resins, such as a polyester resin, a polyethylene naphthalate resin, and a polyimide resin, may be used as the separator 39. The separator 39 has thickness of 7.5–50 μm. The separator 39 is bonded to the surface of the first thermosetting adhesive layer 35 before the first opening 34 is formed therein and, then, the separator 39 and the thermosetting adhesive layer 35 are both bored to form the first opening 34 in both of them.

Then, the solder powders 38 are charged in the first opening 34 of the first thermosetting adhesive layer 35 under normal temperature, as shown in FIGS. 3(c)–(f).

Although no particular limitation is imposed on the solder powders 38, for example binary compositions comprising Sn/Ag, Sn/Cu, Sn/Sb and Sn/Zn, and multiple compositions comprising Sn/Ag/Cu and Sn/Ag/Cu/Bi, can be cited as the solder powders that may be used. The solder powders 38 having an average particle diameter of not more than 50 μm, or preferably not more than 20 μm, are preferably used.

The solder powders 38 are charged in the first opening 34 of the first thermosetting adhesive layer 35 under normal temperature in the following manner. First, the solder powders 38 are mixed in solvent 40 to prepare a solder paste 41. Then, after a metal mask 42 is disposed on the first thermosetting adhesive layer 35, the solder paste 41 is printed on the first thermosetting adhesive layer 35 through the metal mask 42 under normal temperature, as shown in FIG. 3(c).

Although no particular limitation is imposed on the solvent 40, the solvent 40 that can be removed by drying in the temperature range of 75° C. to 200° C., or preferably 75° C. to 160° C., in the next drying process should preferably be selected. When the solvent that can be dried at temperature lower than 75° C. is selected, storage stability and continuous printability of the solder paste 41 may deteriorate. On the other hand, when the solvent that can be dried at temperature higher than 200° C. is selected, the first thermosetting adhesive layer 35 may be cured in the drying process to such an extent that the adhesion strength of the interface between the first thermosetting adhesive layer 35 and the first conductor layer 22 mentioned later may deteriorate.

More specifically, the solvent 40 prepared by adding e.g. amide resin to aliphatic alcohol to provide viscosity improvement effects is preferably used. The amount of amide resin to be added is in the approximate ratio of 0.005–5% to solder powder 38 by volume.

The solder paste 41 can be prepared, for example, by mixing the solder powders 38 and the solvent 40 to be in the approximate ratio of 1:0.5–2 by volume.

The metal mask 42 is formed in a specific pattern corresponding to the first opening 34. The metal mask 42 is disposed on the first thermosetting adhesive layer 35 and an excessive amount of solder paste 41 for the first opening 34 is printed on the first opening from above the metal mask 42.

Sequentially, the solvent 40 is removed by drying, as shown in FIG. 3(d). The solvent 40 can be dried and removed, for example, by heating it at temperature of 75–200° C., or preferably 75–160° C., as mentioned above, for an adequate time. The drying time may be determined properly, depending on the amount of solder paste 41 charged in the first opening 34 and the size of the first single-sided substrate 30. However, an excessively short drying time causes the solvent to remain in the solder paste 41, so that the remaining solvent may be out-gassed by heating to cause a possible conductive failure. On the other hand, an excessively long drying time causes the first thermosetting adhesive layer 35 to be cured to such an extent that the adhesion strength of the interface between the first thermosetting adhesive layer 35 and the first conductor layer 22 mentioned later may deteriorate. From this point of view, the drying time is preferably in the range of 1 to 5 minutes, for example.

Then, the solder powders 38 are pressed under normal temperature, as shown in FIG. 3(e). The application of pressure on the solder powders 38 can be done by pressing a pressurizer 43, such as a press and a pressure roller, from above the solder powders 38 at 0.5–10 MPa for 1 second to 5 minutes, for example. As a result of the application of pressure, the solder powders 38 are deformed and charged in the first opening 34 in high density. It is preferable that the pressure is applied on the solder powders 38 so that the pressed solder powders 38 in the first opening 34 can have a volume ratio of 40–99%. When the volume ratio of the solder charged in the first opening 34 is less than 40%, the solder powders 38 is low in adhesion. On the other hand, when the volume ratio of the solder powders 38 charged in the first opening 34 is more than 99%, the pressure as high as 100 MPa must be applied on the solder powders, so that there is the possibility that the first single-sided substrate 30 may be cracked.

In this solder powder 38 charging process, all operations, except the operation of removing the solvent 40 by drying, are performed under normal temperature. It should be noted that the phrase of "under normal temperature" is intended to mean "in an atmosphere of room temperature without heating". For example, the operations in the solder powder 38 charging process are done at temperature of 10–50° C., or preferably 15–35° C.

Thereafter, the separator 39 is peeled off and removed together with the surplus solder powders 38 flowing over the first opening 34, as shown in FIG. 3(f). This can allow the solder powders 38 to be charged in the first opening 34 in a simple and reliable manner.

The process shown in FIG. 3 also applies to the process in which the second thermosetting adhesive layer 37 having the second openings 36 is laminated on the fourth conductor layer 32 of the second single-sided substrate 33 and then the solder powders 38 are charged in the second openings 36 under normal temperature.

In this method, as shown in FIG. 1(d), the first thermosetting adhesive layer 35 laminated on the first single-sided substrate 30 is laminated on the first conductor layer 22 of the double-sided substrate 24, and the second thermosetting adhesive layer 37 laminated on the second single-sided substrate 33 is laminated on the second conductor layer 23 of the double-sided substrate 24.

In this lamination process, the first thermosetting adhesive layer 35 laminated on the surface of the third conductor layer 29 of the first single-sided substrate 30 is set in position and adhesively bonded to the surface of the first conductor layer 22 of the double-sided substrate 24. In addition, the second thermosetting adhesive layer 37 laminated on the surface of the fourth conductor layer 32 of the second single-sided substrate 33 is set in position and adhesively bonded to the surface of the second conductor layer 23 of the double-sided substrate 24. Then, those laminations are pressed and/or heated by using heating/pressing devices, such as hot pressing devices and hot pressing rolls. The conditions for the pressuring and/or the heating may be determined properly, depending on the size of the double-sided substrate 24, that of the first single-sided substrate 30 and that of the second single-sided substrate 33. It is preferable that the pressure is set to be in the range of 1–10 MPa, or preferably 3–5 MPa, for example. Also, it is preferable that the heating temperature is set to be in the range of 160–225° C., or preferably 175–200° C., for example. By this pressuring an/or the heating, the first thermosetting adhesive layer 35 and the second thermosetting adhesive layers 37 which are in the B-stage state are cured and, as a result of this, the third conductor layer 29 of the first single-sided substrate 30 is bonded to the first conductor layer 22 of the double-sided substrate 24 through the first thermosetting adhesive layer 35, and the fourth conductor layer 32 of the second single-sided substrate 33 is bonded to the second conductor layer 23 of the double-sided substrate 24 through the second thermosetting adhesive layer 37.

Thereafter, as shown in FIG. 1(e), the solder powders 38 are melted by heating to form a first conductive passage 44 for electrically connecting between the first conductor layer 22 and the third conductor layer 29 which are bonded to each other through the first thermosetting resin layer 35 and a second conductive passage 45 for electrically connecting between the second conductor layer 23 and the fourth conductor layer 32 which are bonded to each other through the second thermosetting resin layer 37. After these processes, a four-layered flexible wired circuit board 46 is produced.

The solder powders 38 can be melted by heating at temperature equal to or higher than a melting temperature of the solder powders 38 used. It is preferable that the solder powders 38 are melted not only by the application of heat thereto but also by the application of pressure thereon at 1–10 MPa, or preferably 3–5 MPa.

The curing of the first thermosetting adhesive layer 35 and the second thermosetting adhesive layer 37 and the melting of the solder powders 38 by heating may be taken sequentially in separate processes or may alternatively be taken simultaneously in the same process by selecting the conditions therefor properly.

In the four-layered flexible wired circuit board 46 thus produced, the second insulating layer 28 and the third insulating layer 31 are each formed as a cover insulating layer. This can provide the result that the second insulating layer 28 and the third insulating layer 31 can be bored in a known process, such as a laser bore hole process and the like, to provide terminal openings 47 for connecting with an external wired circuit board, so as to expose the third conductor layer 29 and the fourth conductor layer 32 from the terminal openings 47.

Also, in this process, since the third conductor layer 29 of the first single-sided substrate 30 is bonded directly to the first conductor layer 22 of the double-sided substrate 24 through the first thermosetting adhesive layer 35 without any insulating layer being interposed therebetween and also the fourth conductor layer 32 of the second single-sided base layer 33 is bonded directly to the second conductor layer 23 of the double-sided substrate 24 through the second thermosetting adhesive layer 37 without any insulating layer being interposed therebetween. This can provide a reduced thickness of the flexible wired circuit board by that extent.

Hence, the four-layered flexible wired circuit board 46 thus produced in this method can provide a higher density wiring and reduction in thickness and size.

In addition, in this method, after the solder powders 38 are charged in the first openings 34 of the first thermosetting adhesive layer 35 and the second openings 37 of the second thermosetting adhesive layer 37 under normal temperature, the first thermosetting adhesive layer 35 and the second thermosetting adhesive layer 37 are laminated on the first conductor layer 22 of the double-sided substrate 24 and the second conductor layer 23 of the same, respectively. More specifically, in the solder powder 38 charging process, the first thermosetting adhesive layer 35 and the second thermosetting adhesive layer 37 are laminated on the first conductor layer 22 and the second conductor layer 23 of the double-sided substrate 24, respectively, in the condition in which the curing of the first thermosetting adhesive layer 35 and the second thermosetting adhesive layer 37 is prevented as much as possible in the heat history for the solvent 40 to be removed from the solder paste 41 by drying. Thus, the first thermosetting adhesive layer 35 and the first conductor layer 22, and the second thermosetting adhesive layer 37 and the second conductor layer 23 are already laminated with each other when the solder powders 38 are melted by heating in the next stage. Hence, even when the first thermosetting adhesive layer 35 and the second thermosetting adhesive layer 37 are reactively cured further by the melting of the solder powders 38 by heating, the adhesion strength of the interface between the first thermosetting adhesive layer 35 and the first conductor layer 22 and the adhesion strength of the interface between and the second thermosetting adhesive layer 37 and the second conductor layer 23 increases as the curing of the first thermosetting adhesive layer 35 and the second thermosetting adhesive layer 37 proceeds. As a result of this, sufficient adhesion strength of the interface therebetween is obtained. Thus, this process can provide improved interlayer connection strength between the first conductor layer 22 and the third conductor layer 29 bonded to each other via the first thermosetting adhesive layer 35 and between the second conductor layer 23 and the fourth conductor layer 32 bonded to each other via the second thermosetting adhesive layer 37 and thus can provide reduced interlayer conductive failure. This enables a four-layered flexible wired circuit board 46 to be produced with high reliability and in a simple and reliable manner.

Further, the first conductive passage 44 and the second conductive passage 45 thus formed can be formed in a simple manner simply by directly interconnecting the mutually bonded first conductor layer 22 and third conductor layer 29 in the first thermosetting adhesive layer 35 and by directly interconnecting the mutually bonded second conductor layer 23 and fourth conductor layer 32 in the second thermosetting adhesive layer 37. This can provide improved production efficiency resulting from the simplified construction and reduced production costs.

Although the four-layered flexible wired circuit board 46 in which the first single-sided substrate 30 and the second single-sided substrate 33 are laminated on the both sides of the double-sided substrate 24, respectively, was taken as an example in the illustration above, no particular limitation is imposed on the number of wired circuit boards laminated, as long as four or more layers are laminated. Also, any combination of the double-sided substrate and the single-sided substrate may be adopted. For example, the double-sided wired circuit boards may be laminated sequentially.

EXAMPLES

While in the following, the present invention will be described in further detail with reference to Example and Comparative Example, the present invention is not limited to any Example and Comparative Example.

Example 1

The double-sided substrate, in which the first conductor layer and the second conductor layer, each comprising a copper foil having thickness of 18 $\mu$m, are laminated on both sides of the first insulating layer comprising polyimide resin having thickness of 13 $\mu$m, respectively, was prepared (See FIG. 2(a)).

Then, after through holes having a diameter of 100 $\mu$m$\phi$ was formed in the double-sided substrate at specified positions thereof by drilling (FIG. 2(b)), the through holes were plated with copper to form the through-hole plated layers having thickness of 18 $\mu$m (FIG. 2(c)).

Sequentially, photoresists comprising dry film resist were laminated on the first conductor layer and the second conductor layer, respectively (See FIG. 2(d)). Then, the photoresists were exposed to light through photomasks corresponding to their specific patterns and then developed, to form the photoresists in specific resist patterns (See FIG. 2(e)).

Then, the first conductor layer and the second conductor layer were each etched by using ferric (II) chloride solution (See FIG. 2(f)) and, thereafter, the photoresists were peeled off, to form the first conductor layer and the second conductor layer in their respective specific wired circuit patterns (See FIG. 2(g)).

The first single-sided substrate in which the third conductor layer comprising a copper foil having thickness of 18 $\mu$m was formed on one surface of the second insulating layer comprising polyimide resin having thickness of 13 $\mu$m was prepared separately. Then, after the third conductor layer was formed in a specific wired circuit pattern by the subtractive process (See FIG. 3(a)), the first thermosetting adhesive layer comprising an adhesive sheet of acrylic adhesive having thickness of 50 $\mu$m was laminated on (temporarily bonded to) the third conductor layer by using a vacuum press at 50° C. under pressure of 1.5 MPa, the first openings having the diameter of 150 $\mu$m$\phi$ were formed in specified areas of the first thermosetting adhesive layer (where the first conductor layer and the third conductor layer are connected with each other) by using the YAG laser (See FIG. 3(b)).

Then, after the metal mask formed in a specific pattern corresponding to the first openings was set in place on the first thermosetting adhesive layer, the solder paste was printed on the first thermosetting adhesive layer through the metal mask (See FIG. 3(c)). The solder paste available from NIHON GENMA MFG. CO. LTD. was used in which the solder powders comprising Sn/Ag having an average particle diameter of 20 $\mu$m, alcohols solvent, and amide resin were mixed in the ratio of 50:49:1 by volume.

Then, after the solvent was dried and removed by heating at 160° C. for 5 minutes (FIG. 3(d)), the solder powders were pressed under normal temperature at 5 MPa for 5 minutes (FIG. 3(e)) and then the surplus solder powders were removed (See FIG. 3(f)).

Further, the second single-sided substrate in which the fourth conductor layer comprising a copper foil having thickness of 18 μm was formed on one surface of the third insulating layer comprising polyimide resin having thickness of 13 μm was prepared. Then, after the fourth conductor layer was formed in a specific wired circuit pattern by the subtractive process, the second thermosetting adhesive layer comprising an adhesive sheet of acrylic adhesive having thickness of 50 μm was laminated on (temporarily bonded to) the fourth conductor layer by using the vacuum press at 50° C. under pressure of 1.5 MPa, the second openings having the diameter of 150 μmφ (were formed in specified areas of the second thermosetting adhesive layer (where the second conductor layer and the fourth conductor layer are connected with each other) by using the YAG laser.

Then, after the metal mask formed in a specific pattern corresponding to the second openings was set in place on the second thermosetting adhesive layer, the solder paste was printed on the second thermosetting adhesive layer through the metal mask. The solder paste available from NIHON GENMA MFG. CO. LTD. was used in which the solder powders comprising Sn/Ag having an average particle diameter of 20 μm, alcohols solvent, and amide resin were mixed in the ratio of 50:49:1 by volume.

Then, after the solvent was dried and removed by heating at 160° C. for 5 minutes, the solder powders were pressed under normal temperature at 5 MPa for 5 minutes and then the surplus solder powders were removed.

Then, the first thermosetting adhesive layer laminated on the first single-sided substrate was positioned on the first conductor layer of the double-sided substrate to be in alignment therewith and was put into close contact therewith. Also, the second thermosetting adhesive layer laminated on the second single-sided substrate was positioned on the second conductor layer of the double-sided substrate to be in alignment therewith and was put into close contact therewith. Thereafter, the first thermosetting adhesive layer and the second thermosetting adhesive layer were heated at 200° C. under pressure of 5 MPa for 30 minutes, so that the first single-sided substrate was laminated on the first conductor layer of the double-sided substrate and the second single-sided substrate was laminated on the second conductor layer of the double-sided substrate (See FIG. 1(d)).

Thereafter, the solder powders were melted by heating at 230° C. under pressure of 5 MPa for 3 minutes, to form the first conductive passage for electrically connecting between the first conductor layer and the third conductor layer which were bonded to each other through the first thermosetting adhesive layer and the second conductive passage for electrically connecting between the second conductor layer and the fourth conductor layer which were bonded to each other through the second thermosetting adhesive layer. After these processes, the four-layered flexible wired circuit board was produced (See FIG. 1(d)). The second insulating layer and the third insulating layer of the four-layered flexible wired circuit board thus obtained were bored at specific areas thereof by using the YAG laser, to form the terminal openings.

The overall thickness of the four-layered flexible wire circuit board thus obtained was 193 μm.

Comparative Example 1

The double-sided substrate, in which the first conductor layer and the second conductor layer, each comprising a copper foil having thickness of 18 μm, were laminated on both sides of the first insulating layer comprising polyimide resin having thickness of 13 μm, respectively, was prepared, first (See FIG. 4(a)). Then, the second insulating layer and the third insulating layer, each comprising polyimide resin having thickness of 13 μm, were laminated on the first conductor layer and the second conductor layer of the double-sided substrate through the first adhesive layer and the second adhesive layer comprising acrylic adhesive having thickness of 25 μm, respectively (See FIG. 4(b)).

The first single-sided substrate, in which the third conductor layer comprising a copper foil having thickness of 18 μm was laminated on the four insulating layer comprising polyimide resin having thickness of 13 μm, and the second single-sided substrate, in which the fourth conductor layer comprising a copper foil having thickness of 18 μm was laminated on the fifth insulating layer comprising polyimide resin having thickness of 13 μm, were prepared separately (See FIG. 4(c)). Then, the first cover insulating layer comprising polyimide resin having thickness of 13 μm was laminated on the third conductor layer of the first single-sided substrate through the third adhesive layer comprising acrylic adhesive having thickness of 15 μm, and the second cover insulating layer comprising polyimide resin having thickness of 13 μm was laminated on the fourth conductor layer of the second single-sided substrate through the fourth adhesive layer comprising acrylic adhesive having thickness of 15 μm (See FIG. 4(d)).

Then, the fourth insulating layer of the first single-sided substrate was laminated on the second insulating layer laminated on the double-sided substrate through the fifth adhesive layer comprising acrylic adhesive having thickness of 25 μm, and the fifth insulating layer of the second single-sided substrate was laminated on the third insulating layer laminated on the double-sided substrate through the sixth adhesive layer comprising acrylic adhesive having thickness of 25 μm. After these processes, the four-layered flexible wired circuit board was obtained (See FIG. 1(e)). The overall thickness of the four-layered flexible wired circuit board thus obtained was 293 μm.

While the illustrative embodiment and example of the present invention are provided in the above description, such is for illustrative purpose only and it is not to be construed restrictively. Modification and variation of the present invention that will be obvious to those skilled in the art is to be covered by the following claims.

Capabilities of Exploitation in Industry

As mentioned above, a multilayer flexible wired circuit board of the present invention produced by a method of producing the multilayer flexible wired circuit board of the present invention is effectively usable as a multilayer flexible wired circuit board which is required for high density wiring and reduction in thickness and size.

What is claimed is:

1. A multilayer flexible wired circuit board comprising:
    a double-sided substrate having conductor layers laminated on both sides of an insulating layer, said double-sided substrate containing at least one through hole; and
    a single-sided substrate including a conductor layer connected on one side to an insulating layer, and to an adhesive layer on another side of said conductor layer, said single-sided substrate being bonded to said double-sided substrate using said adhesive layer;
    wherein said adhesive layer is disposed through said at least one through hole to connect said double-sided substrate to said single-sided substrate.

2. The multilayer flexible wired circuit board according to claim 1, further comprising:

conductive passages formed in said adhesive layer, for electrically connecting said conductor layer of said single-sided substrate and said conductor layers of said double-sided substrate.

3. The multilayer flexible wired circuit board according to claim 2, wherein the conductive passages are formed by solder powders, which are charged in openings formed to extend through the adhesive layer in a thickness direction thereof, to abut said conductor layer, and being melted by heating in a condition in which the double-sided substrate is connected to said conductor layer of said single-sided substrate.

4. A method of producing a multilayer flexible wired circuit board comprising:

preparing a double-sided substrate in which conductor layers are laminated on both sides of an insulating layer, respectively, said double-sided substrate having at least one through hole;

preparing a single-sided substrate including a conductor layer connected on one side to an insulating layer, and to an adhesive layer on another side of said conductor layer; and bonding said conductor layer of said single-sided substrate to the conductor layers of said double-sided substrate, through said adhesive layer connected to said conductor layer;

wherein in said bonding step, said adhesive layer is pressed into said at least one through hole to connect the double-sided substrate to said conductor layer of said single-sided substrate.

5. The method of producing a multilayer flexible wired circuit board according to claim 4, further comprising:

forming conductive passages for electrically connecting the bonded conductor layers of the double-sided substrate and said conductor layer of said single-sided substrate, said conductive passage forming step comprising:

forming openings to extend through the adhesive layer in a thickness direction thereof;

charging solder powders in the openings under normal temperature; and pressing said double-sided substrate and said conductor layer of said single sided substrate together such that said solder powders are compressed in said openings; and melting the solder powders charged in the openings by heating in a condition in which the double-sided substrate and said conductor layer of said single sided substrate are bonded together by said adhesive layer.

6. A multilayer flexible wired circuit board comprising:

a double-sided substrate having conductor layers laminated on both sides of an insulating layer, the double-sided substrate containing at least one through hole; and at least one single-sided substrate having a conductor layer connected to an insulating layer on one side and connected to an adhesive layer on another side of said conductor layer, said adhesive layer having at least one conductive passage in which solder is disposed;

wherein said single-sided substrate and said double-sided substrate are bonded together by said adhesive layer being disposed through said at least one through hole in said double-sided substrate; and wherein said conductive passage provides an electrical connection between said conductor layers of said double-sided substrate and said single-sided substrate.

* * * * *